US009691892B2

(12) United States Patent
Mauder et al.

(10) Patent No.: US 9,691,892 B2
(45) Date of Patent: Jun. 27, 2017

(54) HIGH VOLTAGE TRANSISTOR OPERABLE WITH A HIGH GATE VOLTAGE

(71) Applicant: Infineon Technologies Austria AG, Villach (AT)

(72) Inventors: Anton Mauder, Kolbermoor (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/001,932

(22) Filed: Jan. 20, 2016

(65) Prior Publication Data

US 2016/0218209 A1    Jul. 28, 2016

(30) Foreign Application Priority Data

Jan. 22, 2015    (DE) .......................... 10 2015 201 045

(51) Int. Cl.
*H01L 29/78*    (2006.01)
*H01L 29/10*    (2006.01)
(Continued)

(52) U.S. Cl.
CPC ........ *H01L 29/7813* (2013.01); *H01L 29/086* (2013.01); *H01L 29/0865* (2013.01);
(Continued)

(58) Field of Classification Search
CPC ........... H05B 33/0815; H05B 33/0845; H02M 3/155; H02M 3/33507; H02M 2001/0045; H02M 2005/2932
See application file for complete search history.

(56) References Cited

U.S. PATENT DOCUMENTS 9,105,470 B2 *    8/2015    Noebauer ........... H01L 27/0251
2014/0266125 A1    9/2014    Athalye et al.
(Continued)

FOREIGN PATENT DOCUMENTS

DE    10101568 A1    7/2001
EP    1271655 A2    1/2003

OTHER PUBLICATIONS

Baba, Y., "A Study on a High Blocking Voltage UMOS-FET with a Double Gate Structure", Proceedings of 1992 International Symposium on Power Semiconductor Devices & ICs, Tokyo, Japan, pp. 300-302.

*Primary Examiner* — Dung Le
(74) *Attorney, Agent, or Firm* — Murphy, Bilak & Homiller, PLLC

(57) ABSTRACT

A semiconductor device includes a first load contact, a second load contact and a semiconductor region positioned between the first and second load contacts. The semiconductor region includes: a first semiconductor contact zone in contact with the first load contact; a second semiconductor contact zone in contact with the second load contact; a first conductivity type semiconductor drift zone between the first and second semiconductor contact zones, wherein the semiconductor drift zone couples the first semiconductor contact zone to the second semiconductor contact zone. The semiconductor device further comprises: a trench comprising a control electrode and an insulator. The control electrode extends for at least 75% of the semiconductor drift zone. A drift zone doping concentration and an extension of the semiconductor drift zone defines a blocking voltage of the semiconductor device. The insulator is configured for insulating a voltage that amounts to at least 50% of said blocking voltage.

16 Claims, 7 Drawing Sheets

(51) Int. Cl.
*H01L 29/08* (2006.01)
*H01L 29/423* (2006.01)
*H03K 17/687* (2006.01)

(52) U.S. Cl.
CPC ...... *H01L 29/0878* (2013.01); *H01L 29/0882* (2013.01); *H01L 29/1095* (2013.01); *H01L 29/4236* (2013.01); *H01L 29/42368* (2013.01); *H03K 17/687* (2013.01); *H03K 2217/0081* (2013.01)

(56) References Cited

U.S. PATENT DOCUMENTS

| | | | |
|---|---|---|---|
| 2015/0380537 A1* | 12/2015 | Kato | H01L 29/7813 257/139 |
| 2016/0093728 A1* | 3/2016 | Decker | H01L 29/7813 257/330 |
| 2016/0163849 A1* | 6/2016 | Dupuy | H01L 29/7804 257/334 |
| 2016/0172295 A1* | 6/2016 | Lollio | H01L 29/7813 257/334 |

* cited by examiner

HIGH VOLTAGE TRANSISTOR OPERABLE WITH A HIGH GATE VOLTAGE

PRIORITY CLAIM

This application claims priority to German Patent Application No. 10 2015 201 045.7 filed on 22 Jan. 2015, the content of said application incorporated herein by reference in its entirety.

TECHNICAL FIELD

This specification refers to embodiments of semiconductor devices, to embodiments of circuit arrangements comprising a semiconductor device and to embodiments of methods of controlling a semiconductor device. In particular, this specification refers to embodiments of a power semiconductor device that may be operated with a high gate voltage.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes have been used for various applications including, but not limited to switches in power supplies and power converters.

Nonetheless, mechanical switches are occasionally still being used in the area of load management circuits. For example, a mechanical switch, such as a relay or a so-called circuit breaker, can be used for electrically connecting a load to a power supply, such as a battery or a grid port, and for disconnecting the load from the power supply. Sometimes, such a switch is also referred to as a "master switch" or a "main switch."

SUMMARY

According to an embodiment, a semiconductor device is presented. The semiconductor device comprises a first load contact, a second load contact and a semiconductor region positioned in between said first load contact and said second load contact. The semiconductor region includes a first semiconductor contact zone, the first semiconductor contact zone being in contact with the first load contact; a second semiconductor contact zone, the second semiconductor contact zone being in contact with the second load contact; a semiconductor drift zone, the semiconductor drift zone being positioned between the first semiconductor contact zone and the second semiconductor contact zone and being doped with first dopants of a first conductivity type, wherein the semiconductor drift zone couples the first semiconductor contact zone to the second semiconductor contact zone. The semiconductor device further comprises a trench extending into the semiconductor region along an extension direction that points from the first semiconductor contact zone to the second semiconductor zone, the trench comprising a control electrode and an insulator, the insulator insulating the control electrode from the semiconductor region. The control electrode extends, within said trench, along said extension direction for at least as far as 75% of the total extension of said semiconductor drift zone in said extension direction. The semiconductor drift zone exhibits a drift zone doping concentration of said first dopants, the drift zone doping concentration and said total extension of the semiconductor drift zone defining a blocking voltage of the semiconductor device. The semiconductor device is configured to be set, in dependence of a gate control signal provided to the control electrode by applying a voltage between the control electrode and one of the first load contact and the second load contact, in an on state for conducting a load current between the first load contact and the second load contact, and wherein, during the on-state, the insulator is configured for insulating a voltage of the gate control signal that amounts to at least 50% of said blocking voltage.

According to a further embodiment, a circuit arrangement is presented. The circuit arrangement comprises a power supply, the power supply having a first power output and a second power output and being configured for providing an output voltage greater than 40 V between said first power output and said second power output; a load current path, the load current path being configured for coupling a load to said first power output and said second power output; a semiconductor device included in said load current path, the semiconductor device comprising a control terminal, a first load terminal and a second load terminal, wherein the semiconductor device is arranged to be connected in series to the load by means of said first load terminal and said second load terminal; a control current path, the control current path coupling the power supply to the control terminal; a controllable switch included in said control current path, the controllable switch being configured for receiving a switch control signal and for electrically connecting the control terminal to either the first power output or the second power output in dependence of said switch control signal.

According to yet a further embodiment, a method of controlling a semiconductor device is presented. The semiconductor device to be controlled comprises a first load contact, a second load contact and a semiconductor region positioned in between said first load contact and said second load contact. The semiconductor region includes a first semiconductor contact zone, the first semiconductor contact zone being in contact with the first load contact; a second semiconductor contact zone, the second semiconductor contact zone being in contact with the second load contact; a semiconductor drift zone, the semiconductor drift zone being positioned between the first semiconductor contact zone and the second semiconductor contact zone and being doped with first dopants of a first conductivity type, wherein the semiconductor drift zone couples the first semiconductor contact zone to the second semiconductor contact zone. The semiconductor device further comprises a trench extending into the semiconductor region along an extension direction that points from the first semiconductor contact zone to the second semiconductor zone, the trench comprising a control electrode and an insulator, the insulator insulating the control electrode from the semiconductor region. The control electrode extends, within said trench, along said extension direction for at least as far as 75% of the total extension of said semiconductor drift zone in said extension direction. Further, the semiconductor drift zone exhibits a drift zone doping concentration of said first dopants, the drift zone doping concentration and said total extension of the semiconductor drift zone defining a blocking voltage of the semiconductor device. The method comprises providing a gate control signal to said control electrode with a voltage that amounts to at least 50% of said blocking voltage.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
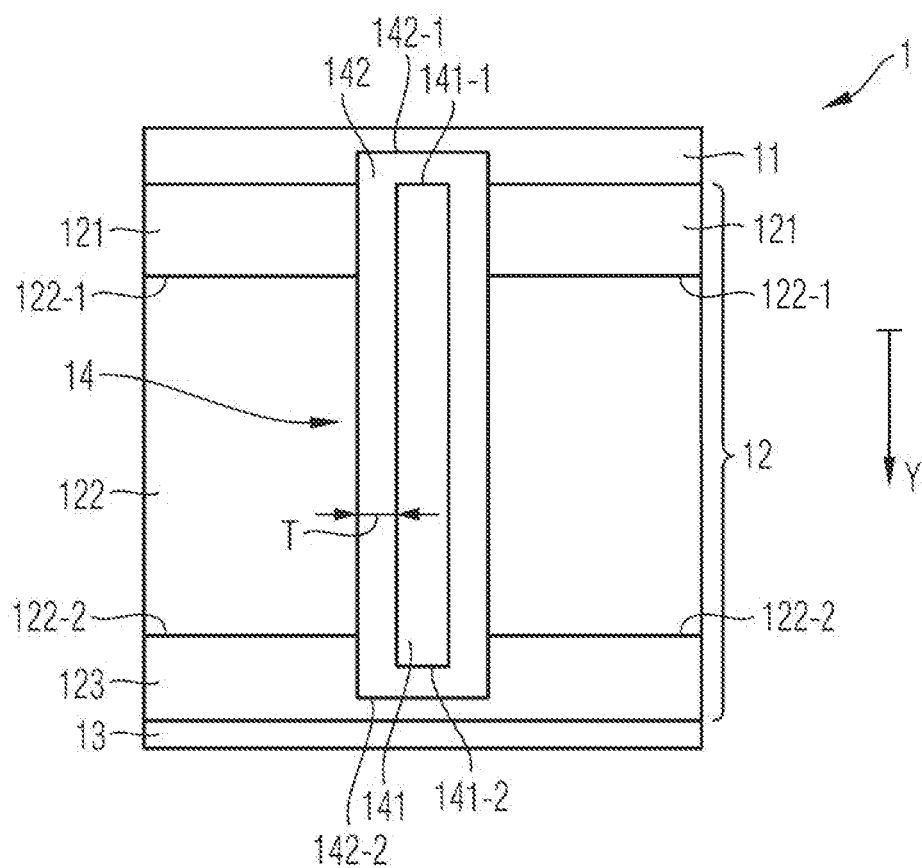
FIG. 1 schematically illustrates a section of a vertical cross-section of a semiconductor device according to one or more embodiments.

In the following detailed description, reference is made to the accompanying drawings which form a part hereof and in which are shown by way of illustration specific embodiments in which the invention may be practiced.

In this regard, directional terminology, such as "top," "bottom," "below," "front," "behind," "back," "leading," "trailing," etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a wafer or a die.

The term "vertical" as used in this specification intends to describe an orientation which is substantially arranged perpendicular to the horizontal surface, i.e., parallel to the normal direction of the surface of the semiconductor substrate or semiconductor region.

In this specification, n-doped may be referred to as "first conductivity type" while p-doped may be referred to as "second conductivity type." Alternatively, opposite doping relations can be employed so that the first conductivity type can be p-doped and the second conductivity type can be n-doped. For example, an n-doped semiconductor region can be produced by inserting donors into a semiconductor region. Further, a p-doped semiconductor region can be produced by inserting acceptors into a semiconductor region.

In the context of the present specification, the terms "in ohmic contact", "in electric contact," "in ohmic connection," and "electrically connected" intend to describe that there is a low ohmic electric connection or low ohmic current path between two regions, sections, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, embodiments of a power semiconductor device, such as a monolithically integrated MOSFET, e.g., to a monolithically integrated power MOSFET that may be operated as a master switch or, respectively as a main switch for connecting a load to a power supply and for disconnecting the load from the power supply, which may include, e.g., a battery providing a DC voltage, a charge pump providing a DC voltage, a grid port providing an AC voltage, an inverter circuit providing an AC voltage or a rectifier circuit providing a DC voltage.

The term "power semiconductor device" as used in this specification intends to describe a semiconductor device on a single chip with high voltage blocking and/or high current-carrying capabilities. In other words, said power semiconductor devices are intended for high current, such as in the Ampere range, e.g., up to several Ampere, and/or high voltages, such as above 40 V, 100 V and above.

Figure 2:
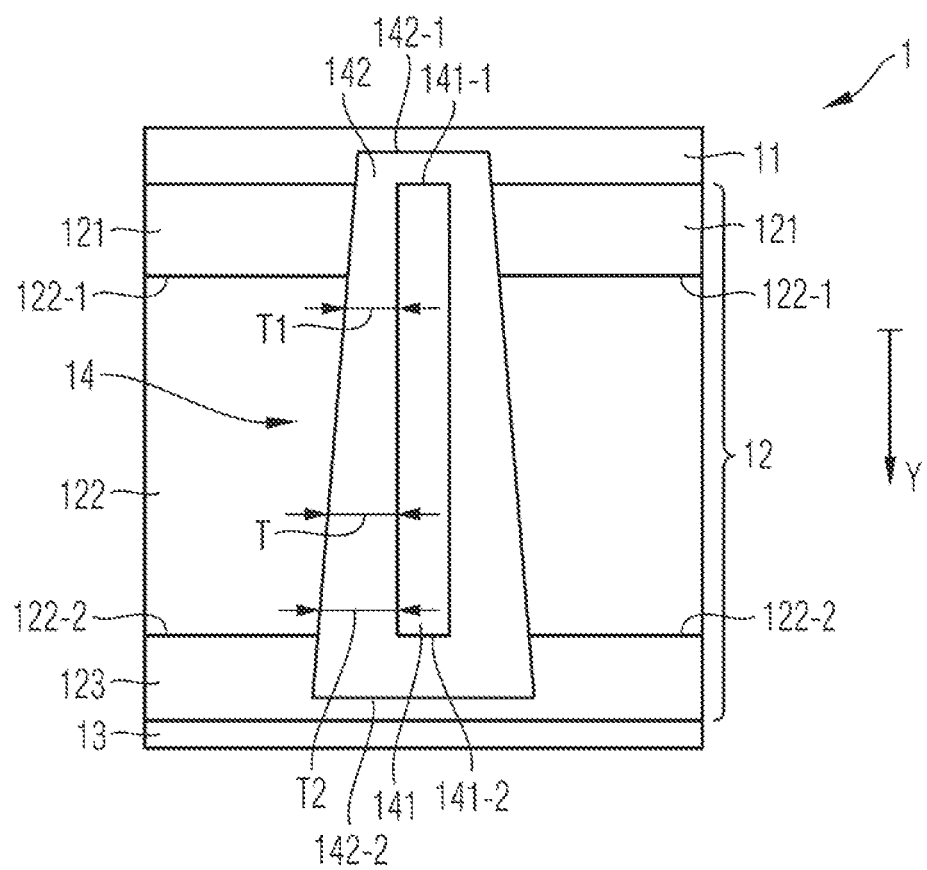
FIG. 2 schematically illustrates a section of a vertical cross-section of a semiconductor device according to one or more embodiments.

FIG. 1 and FIG. 2 schematically illustrate a section of a vertical cross-section of a semiconductor device 1 according to some embodiments. In the following, it will be referred to both FIG. 1 and FIG. 2.

The semiconductor device 1 comprises a first load contact 11, which can be a so-called source contact. On the opposite side, the semiconductor device 1 comprises a second load contact 13, which can be a so-called drain contact. In between said first load contact 11 and said second load contact 13, there is arranged a semiconductor region 12. The semiconductor region 12 may be configured for conducting a load current from the first load contact 11 to the second load contact 13 and/or in the opposite direction, i.e., from the second load contact 13 to the first load contact 11.

The semiconductor region 12 includes a first semiconductor contact zone 121 that is in contact with the first load contact 11. A second semiconductor contact zone 123, which is also part of a semiconductor region 12, is in contact with the second load contact 13.

The semiconductor region 12 further includes a semiconductor drift zone 122 that is positioned between the first semiconductor contact zone 121 and the second semiconductor contact zone 123. The semiconductor drift zone 122 is doped with first dopants of a first conductivity type. For example, the semiconductor drift zone 122 is an n$^-$-doped semiconductor zone.

The semiconductor drift zone 122 couples the first semiconductor contact zone 121 to the second semiconductor contact zone 123. The semiconductor contact zones 121 and 123 may also be doped with dopants, which will be explained in more detail with respect to FIG. 3A and to FIG. 4.

The semiconductor device 1 further comprises a trench 14 that extends into the semiconductor region 12 along an extension direction Y that points from the first semiconductor contact zone 121 to the second semiconductor contact zone 123.

For example, the first load contact 11 is arranged on a front side of the semiconductor device 1 and the second load contact 13 is arranged on a back side of the semiconductor device 1. Thus, the extension direction Y may be in parallel to the vertical or to the horizontal. In other words, the extension direction may be substantially in parallel to a direction of an electrical field caused by a voltage difference between the first load contact 11 and the second load contact 13.

The trench 14 comprises a control electrode 141 and an insulator 142. The insulator 142 insulates the control electrode 141 from the semiconductor region 12. For example, the insulator 142 comprises a dielectric material.

As schematically illustrated in FIG. 1 and in FIG. 2, the control electrode 141 extends, within said trench 14, along said extension direction Y for at least as far as 75% of a total extension of the semiconductor drift zone 122 in said extension direction Y. In accordance with the examples illustrated in FIG. 1 and in FIG. 2, the control electrode 141 even extends more than 100% of said total extension of the semiconductor drift zone 122.

Moreover, the semiconductor drift zone 122 exhibits a drift zone doping concentration of said first dopants, wherein the drift zone doping concentration and said total extension of the semiconductor drift zone 122 define a blocking voltage of the semiconductor device 1.

For example, said blocking voltage of the semiconductor device 1 is a blocking voltage between the first load contact 11 and the second load contact 13. In an embodiment, the semiconductor device 1 may be controlled, e.g., turned-on and turned-off, by providing a gate control signal to said control electrode 141. For example, such gate control signal is provided by generating a voltage difference between the control electrode 141 and the first load contact 11 or, respectively, by generating a voltage difference between the control electrode 141 and the second load contact 13. Accordingly, the voltage of the gate control signal may be a so-called gate-source voltage, or, respectively, a gate-drain-voltage. For example, by varying the voltage of the gate control signal, the semiconductor device 1 may be turned-on or turned-off.

When being in an on-state, the semiconductor device 1 may be configured for carrying said load current. When being in an off-state, the semiconductor device 1 may be configured for blocking flow of a load current, as long as the voltage between the first load contact 11 and the second load contact does not substantially exceed said blocking voltage. Thus, as used herein, the term "blocking voltage" may refer to a minimum breakdown voltage of the semiconductor device 1, e.g., to a minimum drain-source breakdown voltage. For example, even if the semiconductor device 1 is operated in the off-state, flow of load current may not be blocked anymore if the voltage between the first load contact 11 and the second load contact 13 substantially exceeds said blocking voltage.

The insulator 142 may be configured for insulating a voltage that amounts to at least 50% of said blocking voltage. In other words, the insulator 142 may exhibit an insulation voltage that amounts to at least 50% of said blocking voltage. Therefore, in accordance with an embodiment, said gate control signal that may be provided to the control electrode 141, e.g., by generating a voltage difference between the control electrode 141 and the first load contact 11 or, respectively, by generating a voltage difference between the control electrode 141 and the second load contact 13, may be provided with a voltage that amounts to at least 50% of said blocking voltage.

For example, the blocking voltage of the semiconductor device 1 amounts to at least 40 V, to at least 100 V, to at least 300 V, to at least 600 V, or to at least 900 V or even more than 900 V.

A configuration of the insulator 142 can be chosen in dependence of the blocking voltage that is defined, as elaborated above, by the total extension of the semiconductor drift zone 122 and the drift zone doping concentration. For example, the insulation voltage of the insulator 142 can be adjusted by means of a thickness T of the insulator 142 and/or by means of the material of the insulator 142. Examples regarding the thickness T and the material of the insulator 142 will be explained in more detail below.

In an embodiment, the insulator is configured for insulating a voltage that amounts to more than 50% of said blocking voltage, e.g. for insulating a voltage that amounts to at least 75% of said blocking voltage, or a voltage that amounts to at least 100% of said blocking voltage. Thus, in an example, if the semiconductor device 1 exhibits a blocking voltage of 500 V, said gate control signal may be provided to the control electrode 141 with a voltage that also amounts to 500 V. Since the insulator 142 is configured for insulating such voltage, no damages occur to the semiconductor device 1.

For example, the insulator 142 may be configured for withstanding an electrical field strength of more than 1 MV/cm, such as more than 2 or 3 MV/cm. Further, the insulator 142 may extend through the semiconductor drift zone 122 of the semiconductor device 1, e.g., even into the area of the second semiconductor contact zone 123.

The control electrode 141, which may be a gate electrode of the semiconductor device 1, exhibits a proximal end 141-1 and a distal end 141-2. The control electrode 141 may extend from the proximal end 141-1 to the distal end 141-2 along said extension direction Y, as illustrated in FIG. 1 and FIG. 2. Analogously, the insulator 142 may exhibit a proximal end 142-1 and a distal end 142-2 and may extend from its proximal end 142-1 to its distal end 142-2 along said extension direction Y. Further, the total extension of the insulator 142 along said extension direction Y, i.e., the distance between proximal end 142-1 and the distal end 142-2 of the insulator 142, may be greater than the total extension of the control electrode 141 along said extension direction Y, i.e., greater than the distance between the proximal end 141-1 and the distal end 141-2 of the control electrode 141.

For example, the total length of the control electrode 141 defined by the proximal end 141-1 and the distal end 141-2 may amount to at least 75% of said total extension of the semiconductor drift zone 122. In an embodiment, the length of the control electrode 141 is even greater than the total extension of the semiconductor drift zone 122. Thus, the control electrode 141 may extend from the proximal end 141-1 to the distal end 141-2 along said extension direction Y for more than 100% of said total extension of the semiconductor drift zone 122.

For example, a first transition 122-1 between the first semiconductor contact zone 121 and the semiconductor drift zone 122 is positioned deeper in said semiconductor region 12 as compared to the proximal end 141-1 of the control electrode 141. In other words, the first transition 122-1 may be arranged below the proximal end 141-1 of the control electrode 141. Moreover, the distal end 141-2 of the control electrode 141 may be arranged deeper within the semiconductor region 12 as compared to a second transition 122-2 between the semiconductor drift zone 122 and the second semiconductor contact zone 123. In other words, the distal end 141-2 may be arranged below said second transition 122-2.

In another embodiment, the distal end 141-2 is arranged above said second transition 122-2 or, respectively, at a same level as said second transition 122-2.

The total extension of the semiconductor drift zone 122 may be defined by the distance between said first transition 122-1 and said second transition 122-2 along said extension direction Y. In an embodiment, the control electrode 141 is positioned such that the distance between the first transition 122-1 and the distal end 141-2 of the control electrode 141, along said extension direction, amounts to at least 75% of the total extension of the semiconductor drift zone 122, e.g., to at least 90%, to at least 100%, or to more than 100% of said total extension. Further, the control electrode 141 may be positioned such that the distance between the proximal end 141-1 of the control electrode 141 and the second transition 122-2, along said extension direction, amounts to at least 75% of the total extension of the semiconductor drift zone 122, e.g., to at least 90%, to at least 100%, or to more than 100% of said total extension. In other words, the control electrode 141 included in the trench 14 may cover at least 75%, or at least 90% or even 100% of the total extension of the semiconductor drift zone 122 along said extension direction Y.

For example, the semiconductor device 1 is a unipolar semiconductor device 1, such as a MOSFET.

In an embodiment, the control electrode 141 is configured for receiving said gate control signal. For example, such gate control signal may be provided by a gate driver (not shown in FIG. 1 to FIG. 4) that may be operatively coupled to the gate electrode 141. Further, the control electrode 141 may be configured for simultaneously inducing both an inversion channel within said first semiconductor contact zone 121 and an accumulation channel within said semiconductor drift zone 122 in dependence of said gate control signal. For example, the induced inversion channel and the induced accumulation channel form a load current channel that electrically connects the first semiconductor contact zone 121 and the second semiconductor zone 123 to each other at least partially. Thereby, the semiconductor region 12 may conduct a load current from the first load contact 11 to the second load contact 13.

For example, the semiconductor device 1 is configured for conducting a load current in the range up to 1 A, up to 10 A, up to 30 A or even higher than 30 A. Further, said established load current channel may electrically connect the first semiconductor contact zone 121 to the second semiconductor zone 123.

The control electrode 141 may be insulated from the first load contact 12 and from the second load contact 13, e.g., by means of said insulator 142. In such embodiment, there is neither an electrical connection between the control electrode 141 and the first load contact 11 nor an electrical connection between the control electrode 141 and the second load contact 13.

The insulator 142 may exhibit a thickness T, in a direction perpendicular to said extension direction Y.

For example, the thickness T of said insulator 142 is chosen in dependence of at least one of: an electrical field strength the insulator 142 shall be able to withstand; a maximum voltage difference between said control electrode 141 and the first semiconductor contact zone 121; a maximum voltage difference between said control electrode 141 and the second semiconductor contact zone 123; a volume and/or a doping concentration of the second semiconductor contact zone 123; a local position of the semiconductor drift zone 122 with respect to the control electrode 141. As the voltages of said first semiconductor contact zone 121, said second semiconductor contact zone 122 and the voltage in the semiconductor drift zone 122 may differ along said extension direction Y, the thickness T of the insulator 142 may be configured according to the maximum of said voltage differences or, alternatively, may vary along said extension direction Y.

As an example, which is schematically illustrated in FIG. 1, the insulator 142 may be homogeneous and exhibit a substantially constant thickness T along said extension direction Y, for example a substantially constant thickness T of at least 1 µm. A method for producing such insulator 142 may include creating a thermally grown oxide and/or a deposited oxide at inner side walls of the trench 14.

In another embodiment of the semiconductor device 1, a section of a vertical cross-section of which is schematically and exemplary illustrated in FIG. 2, said thickness T may increase along said extension direction Y. In other words, a first thickness T1 of the insulator 142 in an upper part of the trench 14 may be smaller as compared to a second thickness T2 in a bottom part of the trench 14. For example, the insulator 142 is designed such that it exhibits the largest thickness in an area where the largest voltage differences are to be expected. The variation of the thickness T may occur gradually, as illustrated in FIG. 2, or stepwise. For example, the second thickness T2 is in the range of 1.1 times to 2.0 times of the first thickness T1. Thus, the thickness T of the insulator 142 may vary along said extension direction Y by a factor in the range of approximately 1.1 to approximately 2.0 as compared to a minimum thickness.

A method for producing the insulator 142 such that the insulator 142 exhibits a thickness T that increases along said extension direction Y may begin with a thermally grown oxide at inner side walls of the trench 14. Then, the surface of the oxide can be nitrided, e.g., by means of a low pressure chemical vapor deposition (LPCVD) and/or by means of an oven process. For example, a depletion of the nitration over the depths of the trench 14 may also be implemented. A thermal oxidation step can be carried out subsequently. Reaction components, such as $O_2$ and/or $H_2O$, can be basically homogeneously distributed along the depth of the trench 14. On the other side, in the upper part of the trench 14, a dielectric, such as silicon nitride ($Si_3N_4$) can be oxidized, whereas in the bottom part of the trench 14, silicon may be oxidized, which may occur faster as compared to the oxidation of silicon nitride. Thus, the resulting thickness of the nitride may be inhomogeneous. Such method may allow for producing a wedge-shaped insulator 142, e.g., made at least partially of silicon dioxide, within one thermal oxidation step. For example, the largest thickness T of the insulator 142 may be produced within the bottom part of the trench 14, e.g., in an area where the highest voltage differences can be expected.

Further, the insulator 142 may exhibit a thickness along said extension direction Y that corresponds to the thickness T in said direction that is perpendicular to the extension direction Y. For example, the distance along the extension direction Y between the proximal end 141-1 of the control electrode 141 and the proximal end 142-1 of the insulator 142 may be substantially identical to the thickness T, in the direction perpendicular to the extension direction Y, being present in said upper part of the trench 14. Further, the distance along the extension direction Y between the distal end 141-2 of the control electrode 141 and the distal end 142-2 of the insulator 142 may be substantially identical to the thickness T, in the direction perpendicular to the extension direction Y, being present in said bottom part of the trench 14.

In an embodiment, the insulator 142 is at least partially implemented as a topological insulator. For example, the insulator 142 comprises or is a topological insulator. The insulator 142 may thus allow for flow of a current that is substantially free of dissipation, at least in an area close to the surface of the trench 14.

The insulator 142 may comprise any material that is suitable for insulating a voltage that amounts to at least 50% of said blocking voltage. For example, the insulator 142 comprises at least one of the following: silicon dioxide, silicon nitride, silicon oxynitride, hafnium oxide.

The semiconductor contact zones 121 and 123 may also be doped. For example, the first semiconductor contact zone 121 is doped with second dopants of a second conductivity type complementary to the first conductivity type. Further, the doping concentration within said first semiconductor contact zone 121 can be at least ten times as high as the drift zone doping concentration. Analogously, the second semiconductor contact zone 123 can be doped with third dopants of either the first or the second conductivity type. Further, a doping concentration within said semiconductor contact zones 123 may be at least ten times as high as the drift zone doping concentrations. Further optional aspects of said semiconductor contact zones 121 and 123 will be explained in more detail with respect to FIG. 3A and to FIG. 4.

Figure 3B:
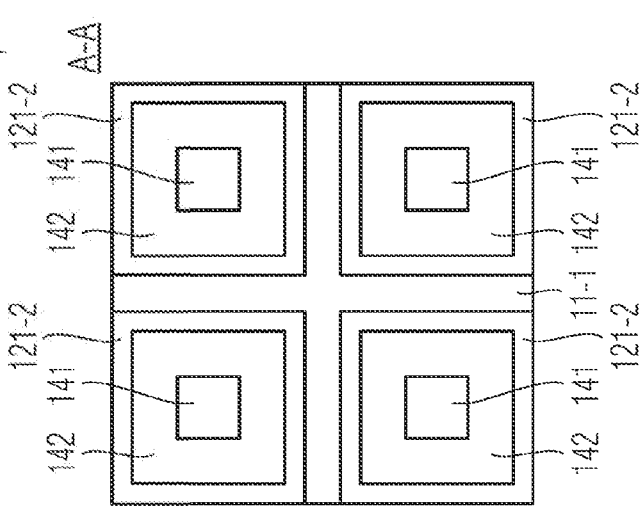
FIG. 3B schematically illustrates a section of a horizontal cross-section of a semiconductor device according to one or more embodiments.
Figure 3A:
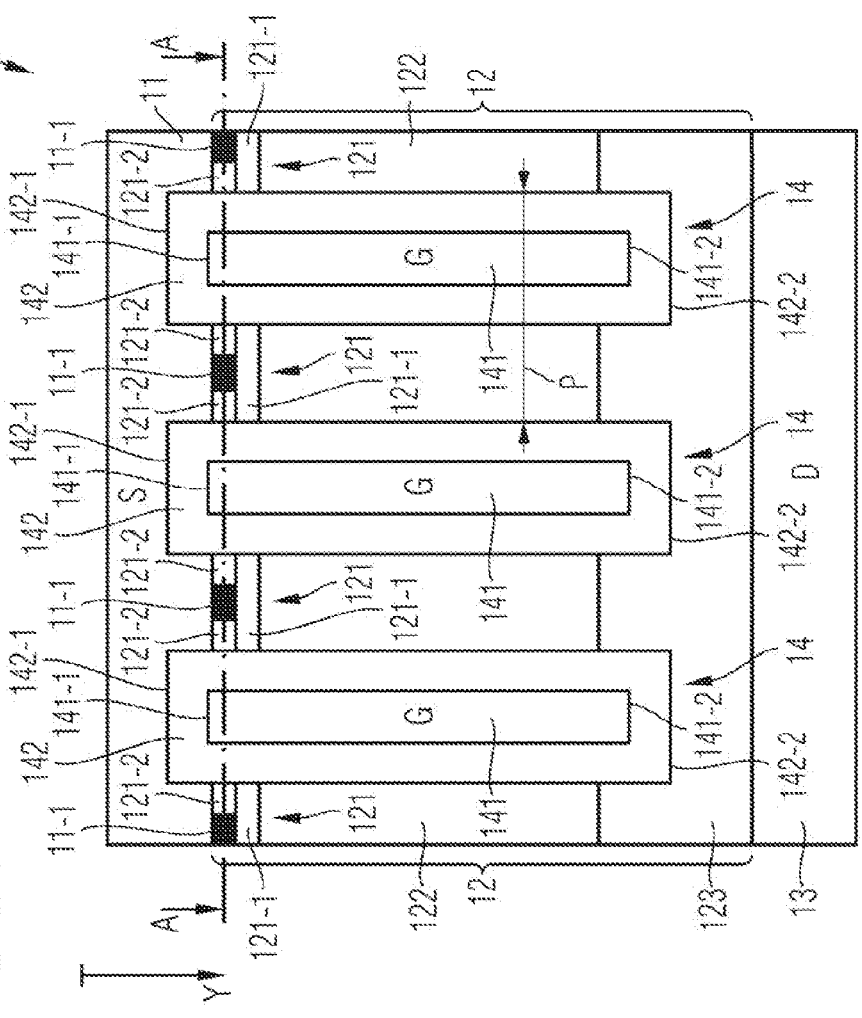
FIG. 3A schematically illustrates a section of a vertical cross-section of a semiconductor device according to one or more embodiments.

FIG. 3A schematically illustrates a section of a vertical cross-section of a semiconductor device 1 according to one or more embodiments and FIG. 3B schematically illustrates a section of a horizontal cross-section along a plane AA of the semiconductor device 1 of FIG. 3A.

The principal setup of the semiconductor device 1 illustrated by FIG. 3A and FIG. 3B essentially corresponds to the setup of the semiconductor device 1 illustrated in FIG. 1 described above. The semiconductor device 1 may comprise a plurality of said trenches 14, which may be arranged periodically, such as with a substantially constant distance between each two adjacent trenches 14, in the following referred to as pitch P. In an embodiment, the pitch P, i.e., the distance between two adjacent trenches 14, is in the range of some µm. For example, the pitch P is in the range of 1 µm to 10 µm, such as in the range of 3 µm to 7 µm.

In the following, an example of a specific configuration of the semiconductor device 1 illustrated in FIG. 3A shall be presented in more detail:

For example, a minimum value of the pitch P can be limited by first the thickness T of the insulator 142 and thus by the maximum possible electric field strength in the insulator 142 and by second a maximum blocking voltage between the control electrode 141 and a neighboring semiconductor region, such as one or more of the semiconductor zones 121, 122 and 123.

The pitch P may be increased due to a width of a respective area needed to provide the semiconductor contact zones 121 and 123 and the control electrode 141. Said widths may be in parallel to said thickness T. For example, the widths may each be in the range between approximately 50 nm and approximately 3 µm. For example, each width amounts to approximately 500 nm. In an embodiment, the pitch P may be linearly scaled with the blocking voltage between the control electrode 141 and the first semiconductor contact zone 121 and dimensions of an area that may be needed for contacting the first semiconductor contact zone 121 and an area needed for creating the control electrode 141 within the trench 14. For example, if said blocking voltage between the control electrode 141 and the first semiconductor contact zone 121 amounts to approximately 600 V and if said maximum electrical field strength in the insulator 142 amounts to approximately 3 MV/cm, the thickness T of the insulator 124 may amount to approximately 2 µm. Further, if said widths of the control electrode 141 and of the first semiconductor contact zone 121 each amount to approximately 500 nm, the pitch P may be in the range of some µm, such as 5 µm.

In addition, the total extension of said semiconductor drift zone 122 along said direction Y may be scaled to the required blocking voltage of the semiconductor device 1, e.g., to the required blocking voltage between the first semiconductor contact zone 121 and the second semiconductor contact zone 123. For example, if the semiconductor drift zone 122 is substantially made of silicon, an extension along said extension direction Y of approximately 8 µm to 10 µm may be appropriate per 100 V.

In an embodiment, the total extension of said semiconductor drift zone 122 along said extension direction Y may amount to several 10 µm. For example, in order to achieve a blocking voltage of approximately 600 V, the total extension of the semiconductor drift zone 122 may amount to approximately 55 µm, e.g., if silicon is used as a material for the semiconductor drift zone 122.

In accordance with a further embodiment, the semiconductor drift zone 122 comprises a wide bandgap material, e.g., SiC. For example, the semiconductor drift zone 122 mainly comprises SiC or, respectively, is substantially made of SiC. This embodiment includes the following recognition: For wide bandgap materials, e.g., SiC, the total extension of the semiconductor drift zone 122 along the extension direction Y can be significantly smaller as compared to silicon, e.g., up to a factor of approximately 10, for a given blocking voltage of the semiconductor device 1. Since the thickness T of the insulator 142 may be independent of the material of the semiconductor drift zone 122, use of a wide bandgap material, e.g., SiC, for creating the semiconductor drift zone 122 may lead to a significant reduction of the depth of the trench 14, i.e., to a significant reduction of the total extension of the trench 14 along said extension direction Y. Such reduced depth of the trench 14 may facilitate the production of the semiconductor device 1. For example, a stress in the semiconductor device 1, e.g., a mechanical stress due to changes in temperature of the semiconductor device 1, can be reduced due to the reduced volume of the insulator 142 within the trench 14.

The first load contact 11 may be a source contact (S) and the second load contact 13 may be a drain contact (D). The control electrodes 141 included in said trenches 14 may be gate electrodes (G) for controlling said semiconductor device 1. Thus, the semiconductor device 1 may be a vertical MOSFET.

As illustrated in FIG. 3A, the semiconductor device 1 may comprise a plurality of separated first semiconductor contact zones 121. Each of the first semiconductor contact zones 121 may comprise a first semiconductor body region 121-1 in contact with the semiconductor drift zone 122. Further, each of the first semiconductor contact zones 121 may comprise a first semiconductor contact region 121-2, which may be in contact with both the first load contact 11 and said first semiconductor body region 121-1.

For example, each first semiconductor body region 121-1 is doped with second dopants of the second conductivity type complementary to the first conductivity type, e.g., each first semiconductor body region 121-1 may be a p-doped region.

Each first semiconductor contact region 121-2 can be doped with third dopants of the first conductivity type. For example, each of the first semiconductor contact regions 121-2 is an $n^+$-doped semiconductor region. For establishing an electrical contact between the first load contact 11 and said first semiconductor contact regions 121-2, there may be arranged first contact elements 11-1 within each first semiconductor contact zones 121. For example, the first dopants are identical to the third dopants.

For example, the first load contact 11 may comprise a metal layer of the semiconductor device 1. The first load contact 11 may comprise at least one of the following materials: aluminum (Al), copper (Cu), nickel (Ni), silver (Ag), gold (Au), platinum (Pt) and/or titanium (Ti). The first load contact 11 may further include, e.g., at a bottom part of the first load contact 11 facing toward the semiconductor region 12, a diffusion barrier layer (not shown). Said diffusion barrier layer may comprise an electrically conductive nitride, such as tantalum nitride (TaN), titanium nitride (TiN). Further, between the first load contact 11 and the semiconductor region 12, there may be arranged a contact plug (not shown), wherein such contact plug may comprise silicon (Si) and/or tungsten (W). In addition, the semiconductor region 12 may comprise an upper contact layer (not shown) arranged in an upper surface region of the semiconductor region 12 and in proximity to the first load contact 11. Said upper contact layer may also comprise an electrically conductive nitride and/or a silicide, such as a titanium silicide, a tantalum silicide and/or a cobalt silicide.

The second load contact 13 and a transition between the second load contact 13 and the semiconductor region 12 may be implemented in a manner similar as explained above with respect to the first load contact 11. Accordingly, the second load contact 13 may also comprise a metal layer. The second load contact 13 may comprise at least one of the following materials: aluminum (Al), copper (Cu), nickel (Ni), silver (Ag), gold (Au), platinum (Pt) and/or titanium (Ti). In addition, the second load contact 13 may include, e.g., in an upper region of the second load contact 13 facing toward the semiconductor region 12, a further diffusion barrier layer (not shown). Said further diffusion barrier layer may comprise an electrically conductive nitride, such as tantalum nitride (TaN), titanium nitride (TiN). Further, between the second load contact 11 and the semiconductor region 12, there may be arranged a further contact plug (not shown), wherein such further contact plug may comprise silicon (Si) and/or tungsten (W). In addition, the semiconductor region 12 may comprise a lower contact layer (not shown) arranged at a lower region of the semiconductor region 12 and in proximity to the second load contact 13. Said lower contact layer may also comprise an electrically conductive nitride and/or a silicide, such as a titanium silicide, a tantalum silicide and/or a cobalt silicide.

The first contact elements 11-1 may be part of the first semiconductor zones 121. Further, said first contact elements 11-1 may comprise a semiconductor material. For example, the first contact elements 11-1 are doped with the same dopants as they may be present within said first semiconductor body regions 121-1, wherein a doping concentration in the first contact elements 11-1 may be higher as compared to a doping concentration in the first semiconductor body regions 121-1.

The second semiconductor contact zone 123 may be comparatively highly doped. For example, the second semiconductor contact zone 123 is doped with the same dopants as compared to the first semiconductor contact region 121-2. For example, the second semiconductor contact zone 123 is an $n^+$-drain contact zone.

As illustrated in FIG. 3B, each control electrode 141 can be insulated from said first semiconductor contact region 121-2 and from said first contact element 11-1 by means of said insulator 142.

Further, each trench 14 may exhibit, in a horizontal cross-section as illustrated in FIG. 3B, a substantially rectangular or quadratic cross-section. In another embodiment, each trench 14 may exhibit, in a horizontal cross-section, a substantially circular or elliptical cross-section (not illustrated). In yet another embodiment, each trench 14 may exhibit, in a horizontal cross-section, a substantially rectangular or quadratic cross-section with rounded corners (not illustrated).

Both the insulator 142 and the control electrode 141 may exhibit a substantially rectangular cross-section, such as a substantially quadratic cross-section, a substantially quadratic cross-section with rounded corners or, respectively, a substantially circular or elliptical cross-section. In an embodiment, the insulator 142 exhibits a substantially quadratic cross-section with an edge width that amounts to some μm. In the example of the specific configuration described above, said edge width may amount to approximately 4.5 μm.

Figure 4:
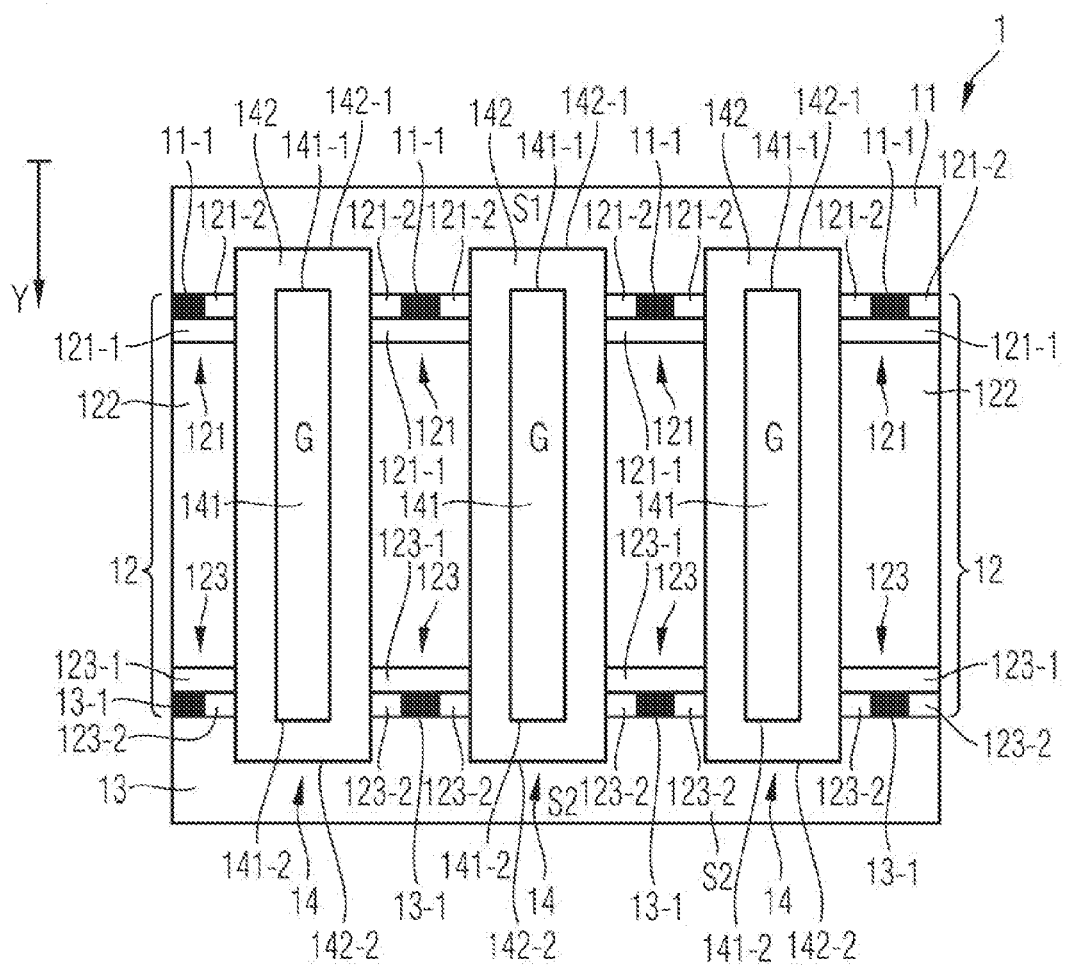
FIG. 4 schematically illustrates a section of a vertical cross-section of a semiconductor device according to one or more embodiments.

FIG. 4 schematically illustrates a section of a vertical cross-section of a further semiconductor device 1 according to one or more embodiments. The principle setup of the semiconductor device 1 of FIG. 4 essentially corresponds to the setup of the semiconductor device 1 illustrated in FIG. 1. In so far, it is referred to the above.

The semiconductor device 1 of FIG. 4 may exhibit an essentially symmetrical vertical structure. For example, the semiconductor device 1 in accordance with FIG. 4 exhibits the following features: Each of the first semiconductor contact zones 121 comprises said first semiconductor body region 121-1 that is in contact with semiconductor drift zone 122 and said first semiconductor contact region 121-2 that is in contact with the first load contact 11. Analogously, the semiconductor device 1 in accordance with FIG. 4 may comprise a plurality of second semiconductor contact zones 123, wherein each of the second semiconductor contact zones 123 may comprise a second semiconductor body region 123-1 that is in contact with semiconductor drift zone 122 and a second semiconductor contact region 123-2 that is in contact with the second load contact 13. Further, each of the first semiconductor body regions 121-1 and the second semiconductor body regions 123-1 may be doped with second dopants of the second conductivity type complementary to said first conductivity type. In addition, each of the first semiconductor contact regions 121-2 and the second semiconductor contact regions 123-2 may be doped with third dopants of said first conductivity type. Thereby, the semiconductor device 1 may be configured to bidirectionally block said blocking voltage and to bidirectionally conduct a load current, i.e., from the first load contact 11 to the second load contact 13 and vice versa, i.e., from the second load contact 13 to the first load contact 11. Thus, the first load contact 11 may be a first source contact (S1) and the second load contact 13 may be a second source contact (S2).

For establishing an electrical contact between the second load contact 13 and the second semiconductor contact zones 123-2, there may be arranged second contact elements 13-1 within each second semiconductor contact zone 123.

The second contact elements 13-1 may be implemented in a similar manner as compared to the first contact elements 11-1 presented above. Accordingly, the second contact elements 13-1 may be part of the second semiconductor zones 123. Further, said second contact elements 13-1 may comprise a semiconductor material. For example, the second contact elements 13-1 are doped with the same dopants as they may be present within said second semiconductor body regions 123-1, wherein a doping concentration in the second contact elements 13-1 may be higher as compared to a doping concentration in the second semiconductor body regions 123-1. Thus, the second contact elements 13-1 can be heavily p-doped semiconductor regions.

For example, the second semiconductor contact regions 123-2 are $n^+$-doped semiconductor regions. Further, the second semiconductor body regions 123-1 can be p-doped semiconductor regions.

Figure 5A:
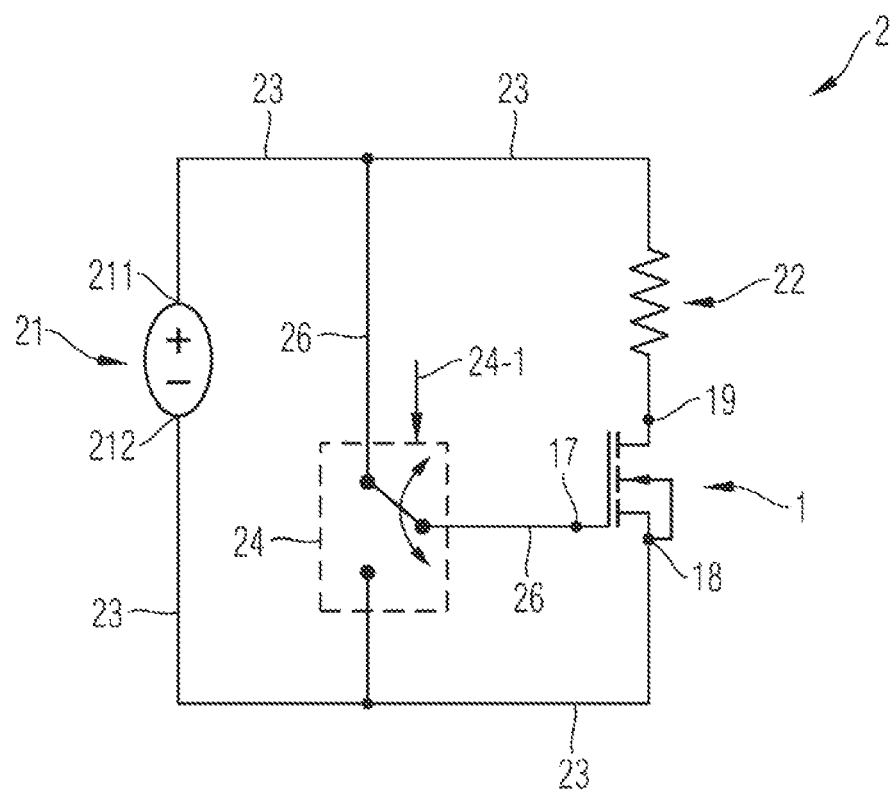
FIG. 5A schematically illustrates a circuit diagram of a circuit arrangement according to one or more embodiments.

FIG. 5A schematically illustrates a circuit diagram of a circuit arrangement 2 according to one or more embodiments. The circuit arrangement 2 includes a power supply 21 for supplying power to a load 22, wherein the power supply 21 has a first power output 211 and a second power output 212. The power supply 21 is configured for providing an output voltage greater than 40 V between said first power output 211 and said second power output 212. For example, the power supply 21 is a battery that provides a DC voltage.

The circuit arrangement 2 further comprises a load current path 23, wherein the load current path is configured for coupling the load 22 to the first power output 211 and the second power output 212. Even though the load 22 is illustrated as a simple Ohmic resistor, it shall be understood that the load 22 can also be a load network or a further circuit configuration that consumes electrical energy. For example, a load current path 23 can comprise cables, connectors, and/or other transmission means for conveying the power provided by the power supply 21 to the load 22.

Within said load current path 23, there is included a semiconductor device 1 that comprises a control terminal 17, a first load terminal 18 and a second load terminal 19. For example, the semiconductor device 1 of the circuit arrangement 2 exhibits a setup as illustrated, e.g., in one of FIG. 1 to FIG. 4.

Accordingly, said first load terminal 18 may be in electrical contact with said first load contact 11 of the semiconductor device 1, the second load terminal 19 may be in contact with said second load contact 13 and said control electrode(s) 141 may be in electrical contact with the control terminal 17 of the semiconductor device 1. Thus, a load current flowing through said load current path 23 may traverse the first load terminal 18, the first contact 11, the semiconductor region 12 including the first semiconductor contact zone(s) 121, the semiconductor drift zone 122 and the second semiconductor contact zone(s) 123, the second load contact 13 and the second load terminal 19 of the semiconductor device 1, if the semiconductor device 1 is operated in an on-state. In other words, the semiconductor device 1 may be connected in series to the load 22 by means of said first load terminal 18 and said second load terminal 19.

The semiconductor device 1 of the circuit arrangement 2 may be an n-channel semiconductor device 1. For example, as explained above, the gate control electrode(s) 141 of the semiconductor device 1 may be configured for simultaneously inducing both an inversion channel within said first semiconductor contact zone 121 and an accumulation channel within said semiconductor drift zone 122 in dependence of said control signal, wherein said semiconductor drift zone 122 may be n-doped. For example, the induced inversion channel and the induced accumulation channel form a load current channel that electrically connects the first semiconductor contact zone 121 and the second semiconductor zone 123 to each other.

The circuit arrangement 2 further comprises a control current path 26, wherein the control current path 26 couples the power supply 21 to the control terminal 17. Further, the control current path 26 includes a controllable switch 24 that is configured for receiving a switch control signal 24-1 and for electrically connecting the control terminal 17 to either the first power output 211 or the second power output 212 in dependence of said switch control signal 24-1.

For example, if the switch control signal 24-1 is provided such that the control terminal 17 of the semiconductor device 1 is electrically connected to the first power output 211. Thus, the electrical potential being present at the first power output 211 may be provided to the control terminal 17 and, therewith, to said control electrode(s) 141. For example, if the electrical potential being present at the first power output 211 is the high potential, such state of the controllable switch 24 may cause the semiconductor device 1 to be turned-on, thereby allowing flow of a load current through the load current path 23 external of the semiconductor device 1 and said load current channel internal of the semiconductor device 1. In such configuration, the electrical potential being present at the first power output 211 may be provided to both the load 22 as well as to the control terminal 17 of the semiconductor device 1. This potential may amount to more than 40 V, such as 100 V, 300 V, 600 V, or even more than 600 V. Further, it shall be noted that the second power output 212 can be electrically connected to ground (not shown).

Providing the switch control signal 24-1 such that the control terminal 17 is electrically connected to the second power output 212 may cause the semiconductor device 1 to be turned-off, thereby blocking flow of a load current through the load current path 23 external of the semiconductor device 1 and said load current channel internal of the semiconductor device 1, i.e., thereby electrically disconnecting the load 22 from the power supply 21. If the semiconductor device 1 is implemented as a p-channel semiconductor device, a control method complementary to the principle explained above may be applied for controlling such p-channel semiconductor device.

In accordance with an embodiment, the power supply 21 not only serves for supplying electrical power to the load 22, but also serves as a gate driver for directly driving the control electrode(s) 141 of the semiconductor device 1. In other words, the semiconductor device 1 may directly be controlled by means of said power supply 21. A further gate driver unit in addition to said controllable switch 24 may be obsolete.

Figure 5B:
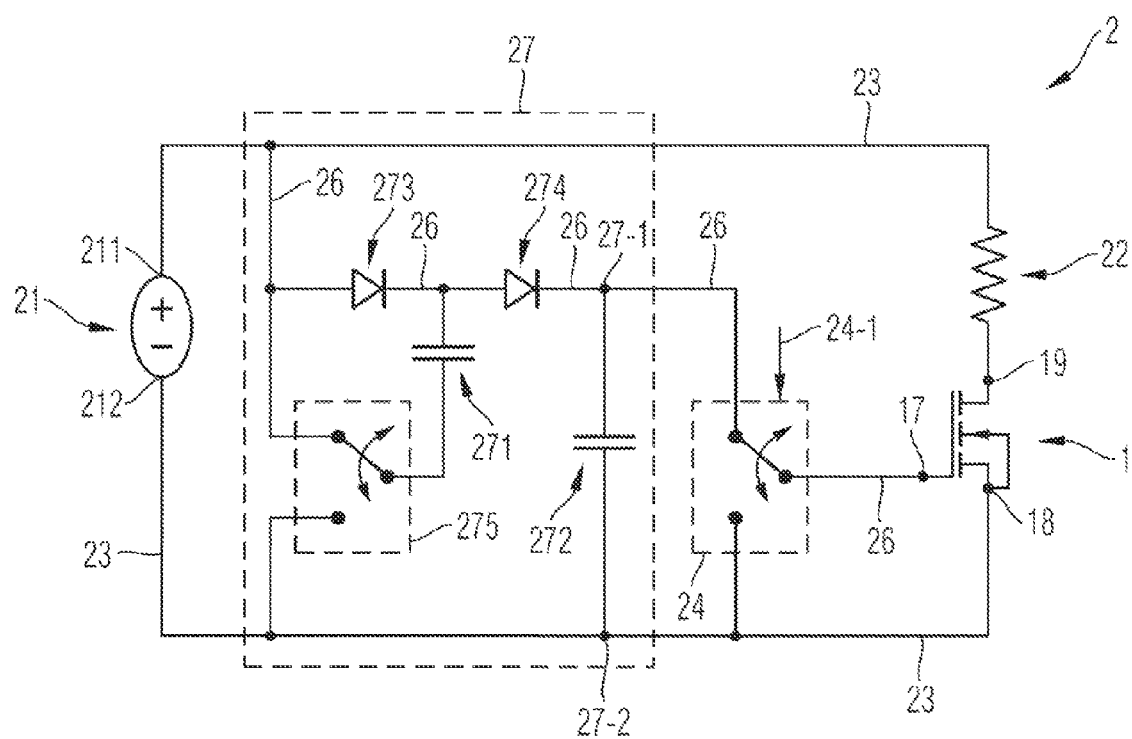
FIG. 5B schematically illustrates a circuit diagram of a circuit arrangement according to one or more embodiments.

In accordance with a further embodiment schematically and exemplary illustrated in FIG. 5B, the circuit arrangement 2 may further comprise a charge pump 27. The charge pump 27 may be arranged downstream of the power supply 21 and upstream of the controllable switch 24. Further, the charge pump 27 may at least partially be included within said control current path 26. For example, the charge pump 27 is configured for receiving the output voltage provided by the power supply 21 and for generating a charge pump output voltage in dependence of the output voltage of the power supply 21, wherein the charge pump output voltage may be greater as compared to the output voltage of the power supply 21. Said controllable switch 24 may be arranged downstream of the charge pump 27 and may be configured for receiving the charge pump output voltage. For example, the controllable switch 24 is configured for electrically connecting the control terminal 17 to either a first output terminal 27-1 of the charge pump 27 or a second output terminal 27-2 of the charge pump 27 in dependence of said switch control signal 24-1, wherein the first output terminal 27-1 is connected to the first power output 211 and wherein the second output terminal 27-1 is connected to the second power output 212.

For example, the charge pump 27 includes an input capacitor 271 and an output capacitor 272. The output capacitor 272 may be configured for providing the charge pump output voltage to the controllable switch 24. Further, the charge pump 27 may comprise a first diode 273 and a second diode 274 as well as a switch arrangement 275, wherein these components of the charge pump 27 may be connected to each other as depicted in FIG. 5B. Both the first diode 273 and the second diode 274 can be included within said control current path 26. The switch arrangement 275 may be configured for electrically connecting an electrode of the input capacitor 271 to either the first power output 211 or the second power output 212 in dependence of a control signal provided to the switch arrangement 275. Another electrode of the input capacitor 271 may be connected to a cathode port of the first diode 273 and an anode port of the second diode 274. An anode port of the first diode 273 can be connected to the first power output 211. A cathode port of the second diode 274 may be connected to an electrode of the output capacitor 272, which may provide the electrical potential of said first output terminal 27-1. The other electrode of the output capacitor 272 may provide the electrical potential of said second output terminal 27-2 and can be connected to the second power output 212. Thereby, the charge pump 27 may be configured for generating the charge pump output voltage that is greater than the output voltage provided by the power supply 21, such as about twice as large as the output voltage provided by the power supply 21. The charge pump output voltage can be provided to the control terminal 17 as said gate control signal by means of the controllable switch 24.

For example, if the semiconductor device 1 is only rarely switched, the semiconductor device 1 may be controlled by said charge pump 27, since the mean current for charging the gate electrode(s) 141 can be comparatively low.

The charge pump 27 may be configured for providing its charge pump output voltage as the gate control signal, for example by providing the charge pump output voltage between the control terminal 17 and one of the first load terminal 18 and the second load terminal 19. The charge pump output voltage may exceed the output voltage provided by said power supply 21. Since a resistance of the semiconductor device 1 in an on-state may depend on the voltage applied between the control electrode 141 and the first semiconductor contact zone 121 or the second semiconductor contact zone 123 and the semiconductor drift zone 122, an increased voltage of the gate control signal may lead to a reduced on-state resistance. As explained above, the blocking capability of the insulator 142 may be designed to fit to the maximum blocking capability of the semiconductor device 1 between said first semiconductor contact zone 121 and said second semiconductor contact zone 123, i.e., to said blocking voltage of the semiconductor device 1. However, the semiconductor device 1 could be designed such that this blocking capability between said first semiconductor contact zone 121 and said second semiconductor contact zone 123 exceeds the output voltage provided by the power supply 21, e.g., for leaving some headroom in case of voltage transients which may occur, e.g., during turning-off the load current through the load 22. Thus, said charge pump 27 may be used to generate the gate control signal with a voltage exceeding the output voltage provided by the power supply 21.

The controllable switch 24 can be realized by means of a semiconductor switch arrangement or by means of mechanical switches.

The load 22 may either be connected between the first power output 211 and the second load terminal 19 (as illustrated in FIG. 5A and FIG. 5B) or, alternatively, or additionally, in between said second power output 212 and said first load terminal 18.

Further, it shall be understood that the control current path 26 may exhibit an Ohmic resistance, such as a gate resistor. Further, the control current path 26 may include a further diode (not shown), e.g., a further diode arranged in such a way that the further diode avoids dissipation of charge included in the control electrode(s) 141, e.g. in the event that the voltage of the power supply 21 suddenly decreases. For example, said further diode may exhibit a cathode port and an anode port, wherein the cathode port is electrically connected to the control terminal 17 and the anode port is connected to the first power output 211 or, respectively, to said first output terminal 27-1 if the circuit arrangement 2 includes the charge pump 27.

Figure 6:
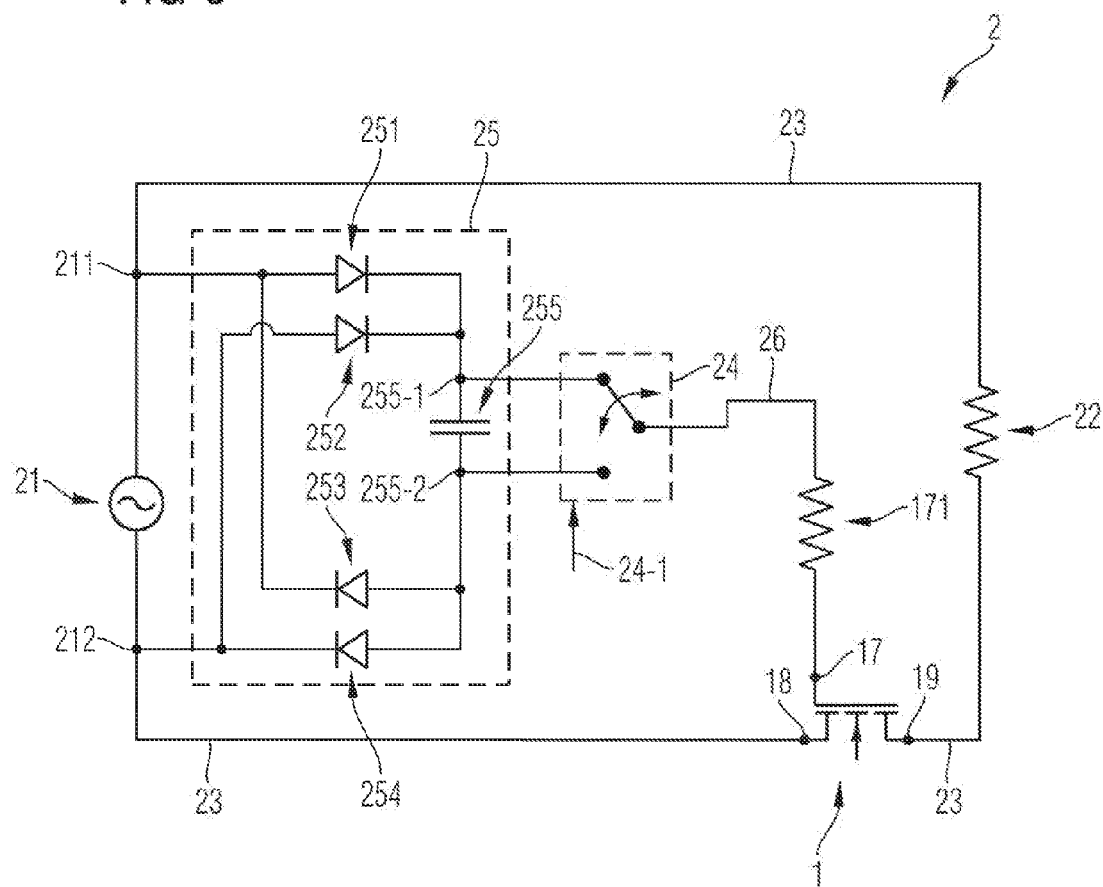
FIG. 6 schematically illustrates a circuit diagram of a circuit arrangement according to one or more embodiments.

FIG. 6 schematically illustrates a circuit diagram of a further circuit arrangement 2 according to one or more embodiments. Essentially, the set-up of the circuit arrangement 2 illustrated in FIG. 6 corresponds to the setup of the circuit arrangement 2 illustrated in FIG. 5A. In accordance with the embodiment illustrated in FIG. 6, the power supply 21 is an AC power supply that provides an AC voltage between said first power output 211 and said second power output 212. In such case, the circuit arrangement 2 may additionally include a rectifier circuit 25, such as a diode bridge. For example, the rectifier circuit 25 includes four diodes 251, 252, 253 and 254 as illustrated in FIG. 6. Further, the rectifier circuit 25 may comprise a buffer capacitor 255 that provides a DC voltage that corresponds to the rectified AC voltage. The DC voltage of the buffer capacitor 255 may be provided by means of DC terminals 255-1 and 255-2.

The control terminal 17 of the semiconductor device 1 is coupled to said DC terminals 255-1 and 255-2 by means of said control current path 26 that may include the controllable switch 24 and a series resistor 171, which may be a gate resistor.

Regarding operation of the circuit arrangement 2 illustrated in FIG. 6, it is referred to the explanations that have been made with respect to FIG. 5A and FIG. 5B. For example, the semiconductor device 1 is turned-on by providing the switch control signal 24-1 such that the control terminal 17 is electrically connected (via series resistor 171) to DC terminal 255-1. Further, the semiconductor device 1 can be turned-off by providing the switch control signal 24-1 such that the control terminal 17 is electrically connected (via series resistor 171) to other DC terminal 255-2.

Further, it shall be understood that the circuit arrangement 2 in accordance with FIG. 6 may also include a charge pump 27. For example, the charge pump 27 may be arranged downstream of the buffer capacitor 255 and upstream of the controllable switch 24.

The semiconductor device 1, as schematically illustrated in one or more of FIG. 1 to FIG. 6, may be operated by providing said gate control signal to said control electrode(s) 141 with a voltage that amounts to at least 50% of said blocking voltage of the semiconductor device 1. For example, as can be derived from the embodiments illustrated in FIG. 5A, FIG. 5B and FIG. 6, the semiconductor device 1 may not only be configured for blocking a voltage that amounts to more than 100% of the output voltage provided by the power supply 21, but may also be operated with a gate control signal (provided to the control terminal 17) that exhibits a voltage also amounting to at least 100% of the output voltage of the power supply 21. Thus, the insulator 142 can be configured for withstanding such voltage.

As explained above, the semiconductor device 1 can be turned-on by providing said gate control signal to the control electrode 141 with a voltage that amounts to at least 50% of said blocking voltage, in accordance to one or more embodiments. For example, for changing the state of the semiconductor device 1, e.g., from an off-state to an on-state or vice versa, the voltage of the gate control signal may amount to at least 40 V.

The embodiments described above include the recognition that a load shall sometimes be connected to a power supply and sometimes be disconnected from the power supply. Occasionally, the rate of connecting the load to the power supply and of disconnecting the load from the power supply can be very low, such as once in an hour, once in a day, or even only once within the entire lifetime of the load. For example, so-called main switches or master switches are used for fulfilling such low rate connecting/disconnecting functionality. In the event of a fault, such as a grid fault or a battery fault or a loss of mass, it may be desirable to disconnect the load from the power supply. For example, mechanical switches may be used for fulfilling said connecting/disconnecting functionality.

However, such mechanical switches may exhibit a comparatively high switch delay time, which may result in damages of the power supply and/or the load in the event of a fault. On the other hand, if a mechanically switch is often switched, i.e., often used for connecting and disconnecting the load from/to the power supply, the wear of the mechanical switch may cause damages or even result in a loss of the functionality of the switch.

In accordance with one or more embodiments, it is proposed to use a semiconductor device instead of a mechanical switch for fulfilling said connecting/disconnecting functionality, e.g., a semiconductor device as schematically illustrated in one of FIG. 1 to FIG. 6. Such semiconductor device may exhibit a comparatively low on-state resistance and may therefore be suited for continuously carrying a load current over a comparatively long time duration with only few losses. For example, the on-state resistance may be reduced by providing said gate control signal with said comparatively high voltage, which may be, as elaborated above, in the range of the blocking voltage of the semiconductor device, e.g., at least 50% of the blocking voltage, at least 75% of the blocking voltage, or even higher, such as at least 100% of the blocking voltage. Due to the low rate switching operation of the semiconductor device, the semiconductor device must not necessarily be designed with respect to low switching losses, but rather exclusively with respect to low on-state losses.

Features of further embodiments are defined in the dependent claims. The features of further embodiments and the features of the embodiments described above may be combined with each other for forming additional embodiments, as long as said features are not explicitly described as being alternative to each other.

For facilitating understanding of exemplary embodiments schematically illustrated in the drawings, some of said control electrodes 141 have been labelled with a "G", which may be an abbreviation for "Gate". The contacts 11 and 13 have occasionally been labelled with an "S", which may be an abbreviation for "Source", or, respectively, with a "D", which may be an abbreviation for "Drain".

As explained above, the insulator 142 may comprise a dielectric material. For example, the insulator 142 comprises at least one of the following: a silicon dioxide, silicon nitride, silicon oxynitride, hafnium oxide. Further, the insulator 142 may comprise a so-called high-k-dielectric. Also, it is possible that the insulator 142 comprises mixtures or alloys of such materials and/or a plurality of layers of different dielectric materials.

Regarding the gate electrode(s) 141, it shall be noted that the gate electrode may comprise polycrystalline silicon, metal silicides, metals and/or electrically conductive ceramics and/or mixtures or alloys of such materials and/or a plurality of layers of different electrically conductive materials.

As explained above, the semiconductor region may mainly be composed of a semiconductor drift zone 122, e.g., a n$^-$-drift region, wherein semiconductor junctions, such as pn-junctions, may be formed by a respective transition between the first semiconductor contact zone 121 and the semiconductor drift zone 122 and/or by a respective transition between the second semiconductor contact zone 123 and the semiconductor drift zone 122.

Further, within this specification, the term "doping concentration" may refer to an integral doping concentration or, respectively, to a mean doping concentration or to a sheet charge carrier concentration of a specific semiconductor region. Thus, e.g., a statement saying that a specific semiconductor region exhibits a certain doping concentration that is higher or lower as compared to a doping concentration of another semiconductor region may indicate that the respective mean doping concentrations of said semiconductor regions differ from each other.

For example, said drift zone doping concentration being present in the semiconductor drift region 122 can be a mean doping concentration with respect to the entire volume of the semiconductor drift region 122. Further, said doping concentrations being present in the semiconductor contact zones 121 and 123, such as in said first and second semiconductor contact regions 121-1 and 123-1, can be respective mean doping concentrations with respect to the entire volume of the first or, respectively, the second semiconductor contact regions.

In the above, embodiments pertaining to semiconductor devices, embodiments pertaining to circuit arrangements including a semiconductor device and embodiments pertaining to methods of controlling a semiconductor devices were explained. For example, these semiconductor devices are based on silicon (Si). Accordingly, a monocrystalline semiconductor region or layer, e.g., the semiconductor zones 121, 122, 123 of exemplary embodiments, is typically a monocrystalline Si-region or Si-layer. In other embodiments, polycrystalline or amorphous silicon may be employed.

It should, however, be understood that the semiconductor zones 121, 122, 123 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGainN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1−x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device, comprising:
a first load contact, a second load contact and a semiconductor region positioned in between said first load contact and said second load contact,
wherein the semiconductor region includes:
a first semiconductor contact zone, the first semiconductor contact zone being in contact with the first load contact;
a second semiconductor contact zone, the second semiconductor contact zone being in contact with the second load contact;
a semiconductor drift zone, the semiconductor drift zone being positioned between the first semiconductor contact zone and the second semiconductor contact zone and being doped with first dopants of a first conductivity type, wherein the semiconductor drift zone couples the first semiconductor contact zone to the second semiconductor contact zone,
wherein the semiconductor device further comprises:
a trench extending into the semiconductor region along an extension direction that points from the first semiconductor contact zone to the second semiconductor zone, the trench comprising a control electrode and an insulator, the insulator insulating the control electrode from the semiconductor region,
and wherein:
the control electrode extends, within said trench, along said extension direction for at least as far as 75% of the total extension of said semiconductor drift zone in said extension direction;
the semiconductor drift zone exhibits a drift zone doping concentration of said first dopants, the drift zone doping concentration and said total extension of the semiconductor drift zone defining a blocking voltage of the semiconductor device; and
the semiconductor device is configured to be set, in dependence of a gate control signal provided to the control electrode by applying a voltage between the control electrode and one of the first load contact and the second load contact, in an on-state for conducting a load current between the first load contact and the second load contact, and wherein, during the on-state, the insulator is configured for insulating a voltage of the gate control signal that amounts to at least 50% of said blocking voltage.

2. The semiconductor device of claim 1, wherein:
the first semiconductor contact zone comprises a first semiconductor body region in contact with semiconductor drift zone and a first semiconductor contact region in contact with the first load contact;
the second semiconductor contact zone comprises a second semiconductor body region in contact with semiconductor drift zone and a second semiconductor contact region in contact with the second load contact;
each of the first semiconductor body region and the second semiconductor body region is doped with second dopants of a second conductivity type complementary to said first conductivity type; and
each of the first semiconductor contact region and the second semiconductor contact region is doped with third dopants of said first conductivity type.

3. The semiconductor device of claim 1, wherein the control electrode has a proximal end and a distal end and extends from the proximal end to the distal end along said extension direction for more than 100% of said total extension of the semiconductor drift zone.

4. The semiconductor device of claim 1, wherein the blocking voltage is at least 40 V.

5. The semiconductor device of claim 1, wherein the insulator is configured for insulating a voltage of the gate control signal applied between the control electrode and said one of the first load contact and the second load contact that amounts to at least 100% of said blocking voltage.

6. The semiconductor device of claim 1, wherein the insulator is at least partially implemented as a topological insulator.

7. The semiconductor device of claim 1, wherein the insulator exhibits a thickness, in a direction perpendicular to said extension direction, of at least 1 μm.

8. The semiconductor device of claim 1, wherein the insulator exhibits a thickness, in a direction perpendicular to said extension direction, that increases along said extension direction.

9. The semiconductor device of claim 1, wherein the control electrode is insulated from the first load contact and from the second load contact.

10. The semiconductor device of claim 1, wherein the semiconductor device is a unipolar semiconductor device.

11. The semiconductor device of claim 1, wherein the control electrode is configured for receiving the gate control signal and for simultaneously inducing both an inversion channel within said first semiconductor contact zone and an accumulation channel within said semiconductor drift zone in dependence of said gate control signal.

12. The semiconductor device of claim 11, wherein the induced inversion channel and the induced accumulation channel form a load current channel that electrically connects the first semiconductor contact zone and the second semiconductor contact zone to each other at least partially.

13. The semiconductor device of claim 1, wherein the first semiconductor contact zone is doped with second dopants of a second conductivity type complementary to the first conductivity type.

14. The semiconductor device of claim 13, wherein a doping concentration within said first semiconductor contact zone is at least ten times as high as the drift zone doping concentration.

15. The semiconductor device of claim 1, wherein the second semiconductor contact zone is doped with third dopants of either the first or the second conductivity type.

16. The semiconductor device of claim 15, wherein a doping concentration within said second semiconductor contact zone is at least ten times as high as the drift zone doping concentration.

* * * * *